(12) United States Patent
Lin et al.

(10) Patent No.: US 10,290,559 B2
(45) Date of Patent: May 14, 2019

(54) THERMAL DISSIPATION THROUGH SEAL RINGS IN 3DIC STRUCTURE

(71) Applicant: Taiwan Semiconductor Manufacturing Company, Ltd., Hsin-Chu (TW)

(72) Inventors: Jing-Cheng Lin, Hsin-Chu (TW); Shih-Yi Syu, Daxi Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 29 days.

(21) Appl. No.: 15/344,838

(22) Filed: Nov. 7, 2016

(65) Prior Publication Data

US 2017/0053849 A1  Feb. 23, 2017

Related U.S. Application Data

(63) Continuation of application No. 13/624,620, filed on Sep. 21, 2012, now Pat. No. 9,490,190.

(51) Int. Cl.
| | |
|---|---|
| *H01L 21/00* | (2006.01) |
| *H01L 23/367* | (2006.01) |
| *H01L 23/48* | (2006.01) |
| *H01L 23/00* | (2006.01) |
| *H01L 25/065* | (2006.01) |

(Continued)

(52) U.S. Cl.
CPC ........ *H01L 23/367* (2013.01); *H01L 21/4882* (2013.01); *H01L 21/76877* (2013.01); *H01L 23/48* (2013.01); *H01L 23/481* (2013.01); *H01L 24/14* (2013.01); *H01L 25/0657* (2013.01); *H01L 25/0756* (2013.01); *H01L 2224/13* (2013.01); *H01L 2224/14135* (2013.01); *H01L 2224/16145* (2013.01);
(Continued)

(58) Field of Classification Search
CPC ............... H01L 23/481; H01L 25/0657; H01L 2224/16145; H01L 2225/06541; H01L 21/76898; H01L 2224/32145; H01L 21/486
USPC ....... 438/106, 107, 622, 637, 638, 639, 667, 438/672
See application file for complete search history.

(56) References Cited

U.S. PATENT DOCUMENTS

| | | |
|---|---|---|
| 6,455,936 B1 | 9/2002 | Lo et al. |
| 6,727,590 B2 | 4/2004 | Izumitani et al. |

(Continued)

FOREIGN PATENT DOCUMENTS

| | | |
|---|---|---|
| CN | 102386168 A | 3/2012 |
| KR | 19980044539 | 9/1998 |

(Continued)

OTHER PUBLICATIONS

Lau, J. H., et al., "Thermal Management of 3D IC Integration with TSV (Through Silicon Via)," 2009 Electronic Components and Technology Conference, IEEE, pp. 635-640.

(Continued)

*Primary Examiner* — S. V. Clark
(74) *Attorney, Agent, or Firm* — Slater Matsil, LLP

(57) ABSTRACT

A die includes a semiconductor substrate, a through-via penetrating through the semiconductor substrate, a seal ring overlying and connected to the through-via, and an electrical connector underlying the semiconductor substrate and electrically coupled to the seal ring through the through-via.

20 Claims, 5 Drawing Sheets

(51) Int. Cl.
*H01L 21/48* (2006.01)
*H01L 21/768* (2006.01)
*H01L 25/075* (2006.01)

(52) U.S. Cl.
CPC ............... *H01L 2225/06589* (2013.01); *H01L 2225/1058* (2013.01); *H01L 2924/181* (2013.01)

(56) References Cited

U.S. PATENT DOCUMENTS

| | | | |
|---|---|---|---|
| 7,952,191 B2 | 5/2011 | Sunohara et al. | |
| 8,021,927 B2 | 9/2011 | Khan et al. | |
| 8,716,122 B2 | 5/2014 | Honma et al. | |
| 8,749,027 B2* | 6/2014 | Chen | H01L 23/585 257/620 |
| 8,796,829 B2 | 8/2014 | Lin | |
| 8,928,159 B2 | 1/2015 | Chang et al. | |
| 9,013,035 B2 | 4/2015 | Zhao et al. | |
| 2003/0122220 A1 | 7/2003 | West et al. | |
| 2005/0098893 A1 | 5/2005 | Tsutsue et al. | |
| 2006/0065972 A1 | 3/2006 | Khan et al. | |
| 2009/0134500 A1* | 5/2009 | Kuo | H01L 23/481 257/659 |
| 2009/0194829 A1 | 8/2009 | Chung et al. | |
| 2009/0206411 A1 | 8/2009 | Koketsu et al. | |
| 2010/0171203 A1* | 7/2010 | Chen | H01L 23/585 257/686 |
| 2010/0187670 A1 | 7/2010 | Lin et al. | |
| 2010/0187671 A1 | 7/2010 | Lin et al. | |
| 2010/0237472 A1 | 9/2010 | Gillis et al. | |
| 2011/0037163 A1 | 2/2011 | Lachner et al. | |
| 2011/0101512 A1 | 5/2011 | Choi et al. | |
| 2011/0176278 A1 | 7/2011 | Park et al. | |
| 2012/0049339 A1 | 3/2012 | Wang | |
| 2012/0056315 A1 | 3/2012 | Chang et al. | |
| 2012/0112322 A1* | 5/2012 | Lin | H01L 21/76898 257/618 |
| 2012/0305916 A1 | 12/2012 | Liu et al. | |
| 2013/0082383 A1 | 4/2013 | Aoya | |
| 2013/0105982 A1 | 5/2013 | Jin et al. | |
| 2013/0175673 A1* | 7/2013 | Jin | H01L 23/481 257/621 |
| 2014/0084444 A1 | 3/2014 | Lin | |
| 2014/0084445 A1 | 3/2014 | Lin | |
| 2014/0084476 A1 | 3/2014 | Lin et al. | |
| 2015/0102497 A1* | 4/2015 | Park | H01L 23/481 257/774 |
| 2015/0294939 A1 | 10/2015 | Yu et al. | |
| 2016/0351472 A1 | 12/2016 | Park et al. | |

FOREIGN PATENT DOCUMENTS

| | | |
|---|---|---|
| KR | 1020100081934 A | 7/2010 |
| KR | 100991623 A | 10/2010 |
| TW | 201125073 A | 7/2011 |
| TW | 201201351 A | 1/2012 |
| TW | 200629521 A | 12/2014 |

OTHER PUBLICATIONS

Nakanekar, S., et al., "Optimal Thermal Characterization of a Stacked Die Package With TSV Technology," 13th IEEE ITHERM Conference, 2012, IEEE, pp. 130-136.

Yamaji, Y., et al., "Thermal Characterization of Bare-die Stacked Modules with Cu through-vias," 2001 Electronic Components and Technology Conference, IEEE, 8 pgs.

* cited by examiner

THERMAL DISSIPATION THROUGH SEAL RINGS IN 3DIC STRUCTURE

This application is a continuation application to U.S. patent application Ser. No. 13/624,620, filed Sep. 21, 2012, entitled "Thermal Dissipation Through Seal Rings in 3DIC Structure," which application is hereby incorporated herein in its entirety by reference.

CROSS-REFERENCE TO RELATED APPLICATIONS

This application relates to the following co-pending U.S. patent applications: application Ser. No. 13/624,471, filed Sep. 21, 2012, and entitled "Thermal Dissipation Through Seal Rings in 3DIC Structure," and application Ser. No. 13/624,757, filed Sep. 21, 2012, and entitled "Thermal Dissipation Through Seal Rings in 3DIC Structure," which applications are hereby incorporated herein by reference.

BACKGROUND

In the packaging of integrated circuits, semiconductor dies may be stacked through bonding, and may be bonded to other package components such as interposers. The resulting packages are known as Three-Dimensional Integrated Circuits (3DICs). The heat dissipation is a challenge in the 3DICs. There exists a bottleneck regarding how to efficiently dissipate the heat generated in the inner dies of the 3DICs. The heat generated in the inner dies has to be dissipated to outer dies before it can be conducted to any heat spreader. Between the stacked dies, however, there exist other materials such as underfill, molding compound, etc, which are not effective in conducting heat.

The solutions for improving the heat dissipation are being developed. For example, micro-channels may be built inside silicon substrates for heat dissipation. Although the micro-channels may be filled with materials or fluids having a good thermal conductivity to improve the overall heat dissipation efficiency of the resulting device die, the manufacturing cost and time-to-market of the device dies became an issue.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A package structure is provided in accordance with various exemplary embodiments. The variations and the operation of the package structure in accordance with embodiments are discussed. Throughout the various views and illustrative embodiments, like reference numbers are used to designate like elements.

Figure 1:
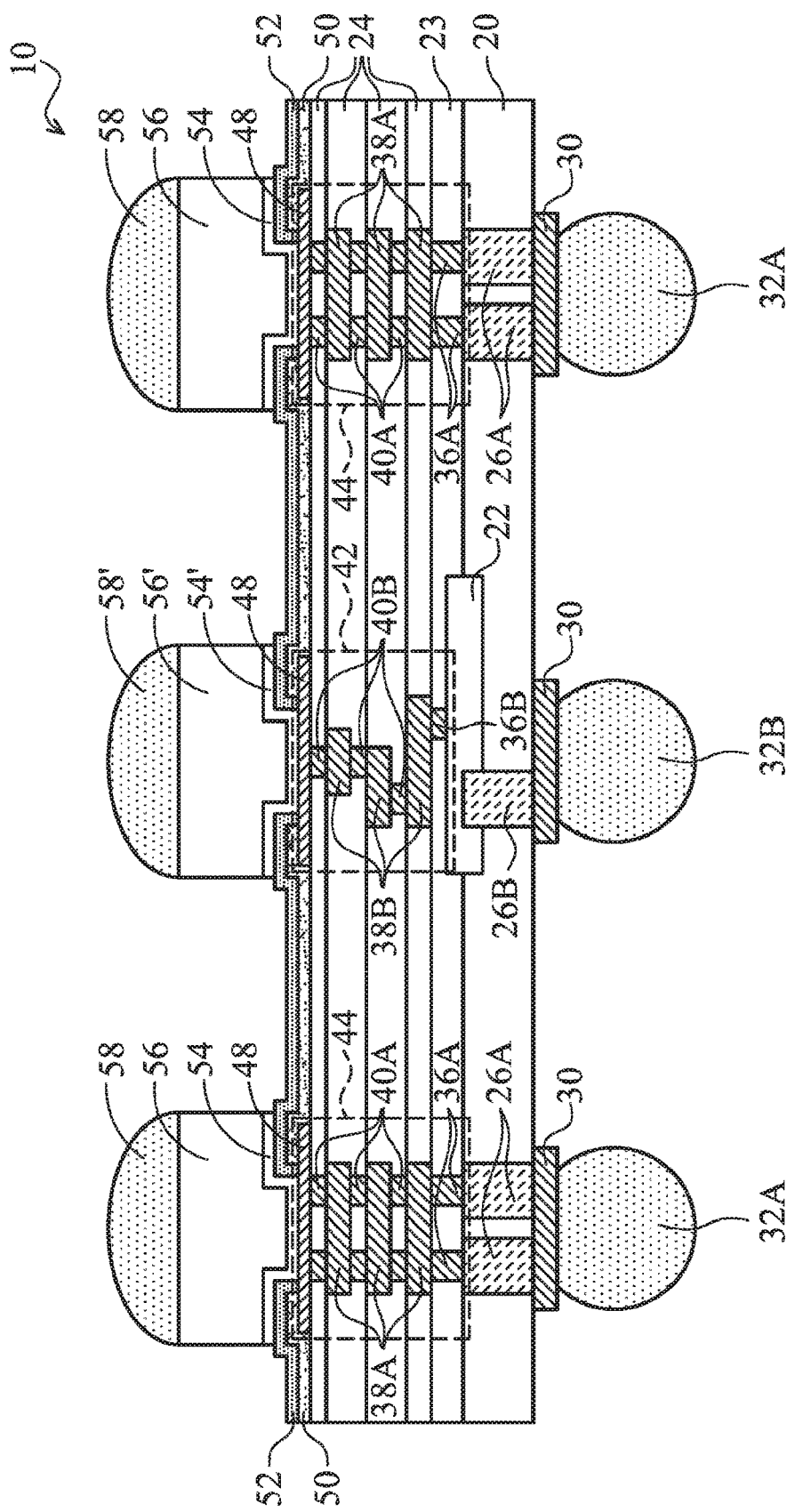
FIG. 1 illustrates a cross-sectional view of a die in accordance with some exemplary embodiments, wherein the die includes a seal-ring-comprising thermal dissipating path for dissipating heat.

FIG. 1 illustrates a cross-sectional view of die 10 in accordance with exemplary embodiments. Die 10 includes semiconductor substrate 20, which may be formed of silicon, silicon germanium, silicon carbon, or a group-III and group-V containing compound semiconductor material. Semiconductor substrate 20 may be lightly doped with a p-type impurity, for example. Active devices 22 such as transistors may be formed at a top surface of substrate 20.

Through Vias (also referred to as through-silicon vias or through-substrate vias) 26A and 26B are formed in, and penetrate through, substrate 20. In the illustrative embodiments, through-vias 26A and 26B have top surfaces level with the top surface of substrate 20. In alternative embodiments, the top surfaces of through-vias 26A and 26B may also be level with or higher than the top surfaces of Inter-Layer Dielectric (ILD) 23. Although a single through-via 26B is illustrated, the single through-via 26B represents a plurality of through-vias 26B. Through vias 26A and 26B are conductive, and may comprise metallic materials such as copper, tungsten, or the like. Backside Redistribution Lines (RDLs) 30 are formed underlying substrate 20, and are electrically coupled to through-vias 26A and 26B. Furthermore, connectors 32 (including 32A and 32B) are formed underlying and electrically coupled to RDLs 30. In some embodiments, connectors 32 comprise solder regions (such as solder balls), although they may also comprise non-reflowable metal pillars such as copper pillars.

Overlying substrate 20 reside dielectric layers 23 and 24. Dielectric layer 23 may be an ILD, which may be formed of Phospho-Silicate Glass (PSG), Boro-Silicate Glass (BSG), Boron-Doped Phospho-Silicate Glass (BPSG), Tetraethyl Orthosilicate (TEOS) oxide, or the like. Dielectric layers 24 may be low-k dielectric layers, which may have dielectric constants (k values) lower than about 3.0, or lower than about 2.5, for example.

In some embodiments, contact plugs 36B are formed in ILD 23, and are electrically coupled to through-vias 26B and/or overlying metal lines 38B and vias 40B. Metal lines 38B and vias 40B are formed in low-k dielectric layers 24, and are portions of interconnect structure 42. Interconnect structure 42 is used for connecting to devices 22, and for coupling devices 22 to the overlying conductive features 54', 56', and 58', which may be used for bonding to an overlying die (shown in FIGS. 2 and 3). It is appreciated that although one set of interconnect structure 42 is illustrated, with one metal line and via illustrated in each of dielectric layers 24, there may be many metal lines, vias, contact plugs etc., in each of dielectric layers 24.

Figure 4:
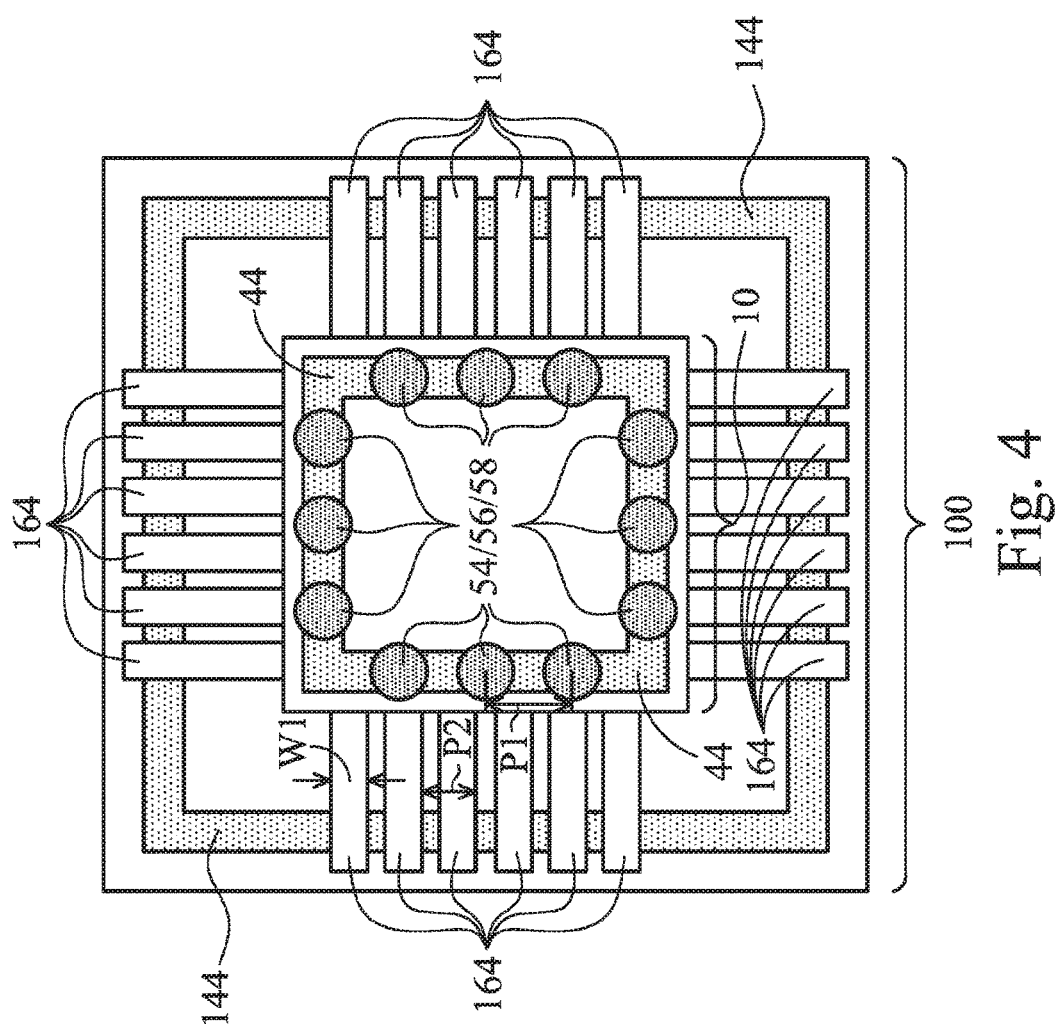
FIGS. 4 and 5 illustrate the top views of the package structures in FIGS. 2 and 3.

Seal ring 44 is formed over and connected to through-vias 26A. Seal ring 44 forms a ring that proximate the edges of die 10, as illustrated in FIG. 4 also. In some embodiments, seal ring 44 includes metal lines 38A and vias 40A in low-k dielectric layers 24. Seal ring 44 may also include contact plugs 36A when through-vias 26A do not extend into ILD 23. In some embodiments, each of metal lines 38A, vias 40A, and contact plugs 36A may form a ring (in a top view of the structure in FIG. 1) that proximate the edges of die 10.

Metal pads 48 are formed over, and connected to, seal ring 44. In some embodiments, metal pads 48 are discrete pads that are separated from each other. In alternative embodiments, metal pads 48 are portions of a continuous metal ring that overlaps seal ring 44, wherein the top-view shape of the continuous metal ring may be similar to the top-view shape of seal ring 44 in FIG. 4. Metal pads 48 may be aluminum pads or aluminum-copper pads. In some embodiments, passivation layer 50 is formed to cover the edge portions of metal pads 48. The central portions of metal pads 48 are exposed through the openings in passivation layer 50. Passivation layer 50 may be a single layer or a composite layer, and may be formed of a non-porous material. In some embodiments, passivation layer 50 is a composite layer comprising a silicon oxide layer (not shown), and a silicon nitride layer (not shown) over the silicon oxide layer. Passivation layer 50 may also comprise Un-doped Silicate Glass (USG), silicon oxynitride, and/or the like. Although one passivation layer 50 is shown, there may be more than one passivation layer.

Polymer layer 52 may be formed over passivation layer 50. Polymer layer 52 may comprise a polymer such as polyimide, benzocyclobutene (BCB), polybenzoxazole (PBO), and the like. Polymer layer 52 is patterned to form openings, through which metal pads 48 are exposed. The patterning of polymer layer 52 may be performed using photo lithography techniques. Although one polymer layer 52 is shown, there may be more than one polymer layer.

Under-Bump Metallurgies (UBM) 54 may be formed over metal pads 48. Each of UBM 54 may comprise a first portion over polymer layer 52, and a second portion extending into the opening in polymer layer 52. In some embodiments, each of UBMs 54 includes a titanium layer and a seed layer, which may be formed of copper or copper alloys. Metal pillars 56 are formed over UBM 54, and are co-terminus with UBM 54, wherein the edges of UBM 54 are aligned to respective edges of metal pillars 56. UBMs 54 may be in physical contact with the respective underlying metal pads 48 and the overlying metal pillars 56. In some exemplary embodiments, metal pillars 56 are formed of a non-reflowable metal(s) that does not melt in reflow processes. For example, metal pillars 56 may be formed of copper or a copper alloy. In addition to metal pillars 56, there may be additional metal layers such as solder regions 58 over metal pillars 56. Metallic features 54', 56', and 58' may be formed of the same materials as, and formed simultaneously with, features 54, 56, and 58, and may be used for electrically coupling to devices 22.

As shown in FIG. 1, seal ring 44, metal pads/line 48, UBMs 54, metal pillars 56, solder regions 58, contact plugs 36A, through-vias 26A, RDLs 30, and connectors 32A form an integrated structure 60, and may all be metal-containing regions. Accordingly, integrated structure 60 has a good thermal conductivity, and hence is referred to as seal-ring-comprising thermal path 60 hereinafter. In some embodiments, seal-ring-comprising thermal path 60 is connected to electrical ground. In alternative embodiments, seal-ring-comprising thermal path 60 is electrically floating.

Figure 2:
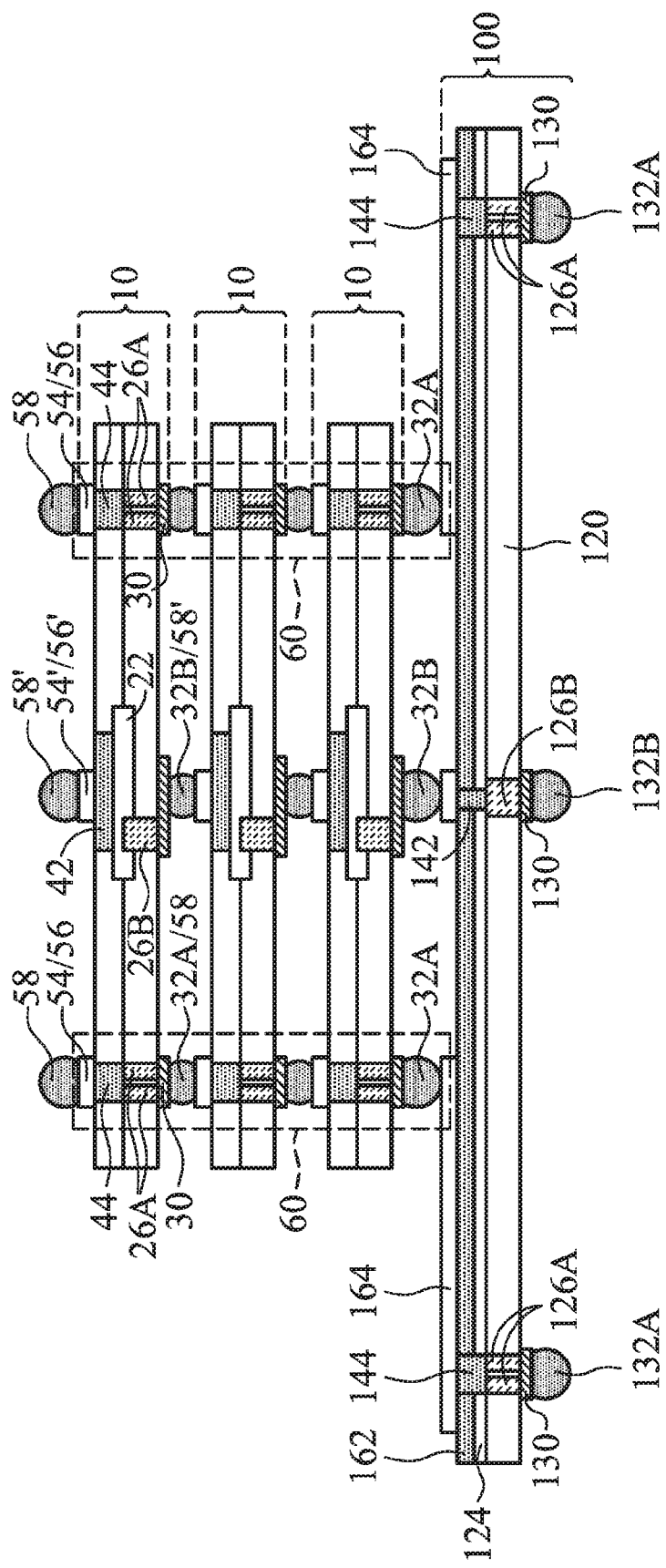
FIGS. 2 and 3 are cross-sectional views of a package structure, which includes stacked dies bonded to an interposer.

FIG. 2 illustrates a Three-Dimensional Integrated Circuit (3DIC) package including dies 10 stacked on package component 100. In some embodiments, package component 100 is an interposer, and hence is referred to as interposer 100 throughout the description, although package component 100 may also be of other types of package components such as a package substrate. In some embodiments, dies 10 are identical to each other. In alternative embodiments, the structures of dies 10 are different from each other. Dies 10 may be memory dies, logic dies, or the like. All of dies 10, or some but not all of dies 10, may have the structure as in FIG. 1. For clarification, a simplified structure of dies 10 is illustrated in FIG. 2, wherein solder regions 32A/32B and 58, metal pillars 56, seal rings 44, interconnect structure 42, through-vias 26A and 26B, and RDLs 30 are illustrated, while other components may not be illustrated, although they may still exist. The detailed structures of seal rings 44 and interconnect structure 42 are not shown in FIG. 2, and may be found referring to FIG. 1.

Dies 10 are stacked, for example, with pre-solder regions 58 and connectors 32A bonded to each other, and pre-solder regions 58' and connectors 32B bonded to each other through reflowing. Active devices 22 in different dies 10 may also be electrically interconnected through through-vias 26B. Under stacked dies 10 is interposer 100, which is bonded to stacked dies 10, for example, through solder bonding. In some embodiments, interposer 100 comprises substrate 120, which may be a semiconductor substrate such as a silicon substrate, or may be a dielectric substrate. Through-vias 126A and 126B penetrate through substrate 120, and may interconnect conductive features (such as 132A/132B and 164) the on opposite sides of substrate 120. In some embodiments, interposer 100 does not comprise any active device such as transistor therein. Interposer 100 may, or may not, comprise passive devices such as resistors, capacitors, or the like, therein.

Through the stacking of dies 10, seal-ring-comprising thermal paths 60 in different dies 10 are interconnected to form a continuous seal-ring-comprising thermal path. Hence, the heat generated in dies 10 may be conducted through the continuous seal-ring-comprising thermal path.

Interposer 100 may also include seal ring 144 proximate the edges of interposer 100. Furthermore, interconnect structure 142 is formed in interposer 100, and may be electrically coupled to active devices 22 in dies 10. Seal ring 144 and interconnect structure 142 may have structures similar to that of seal ring 44 and interconnect structure 42, respectively, which include metal lines and vias in dielectric layers. Seal rings 144 and interconnect structure 142 may further comprise portions in dielectric layers 124, which may, or may not, include low-k dielectric materials. Furthermore, dielectric layer 162 is formed on the top surface of interposer 100. Dielectric layer 162 may include a polymer layer such as a polyimide layer, and may also include passivation layer(s). RDLs 130 and connectors 132 (including 132A and 132B) are formed underlying, and connected to, through-vias 126A and 126B, respectively.

Metal lines 164 may be formed over, and connected to, seal ring 144. In some embodiments, metal lines 164 comprise copper lines. Interposer 100 and metal lines 164 comprise portions overlapped by dies 10, and portions not overlapped by dies 10. Metal lines 164 are further bonded to solder regions 32A and 32B of the overlying die 10. Accordingly, the interconnected seal-ring-comprising thermal path 60 is further expanded to include metal lines 164, seal ring 144, and connectors 132A, which may all be metal-containing features. In some embodiments, when the package as shown in FIG. 2 is operated (powered on), seal-ring-comprising thermal path 60 remains electrically floating or electrically grounded. In some embodiments, seal-ring-comprising thermal path 60 is used for conducting heat, and is not used for conduct electrical signals, currents, or the like. In the illustrated embodiments, heat may be conducted upwardly through seal-ring-comprising thermal path 60, and downwardly to metal lines 164, seal ring 144, through-vias 126A, and conductors 132A in interposer 100.

Figure 3:
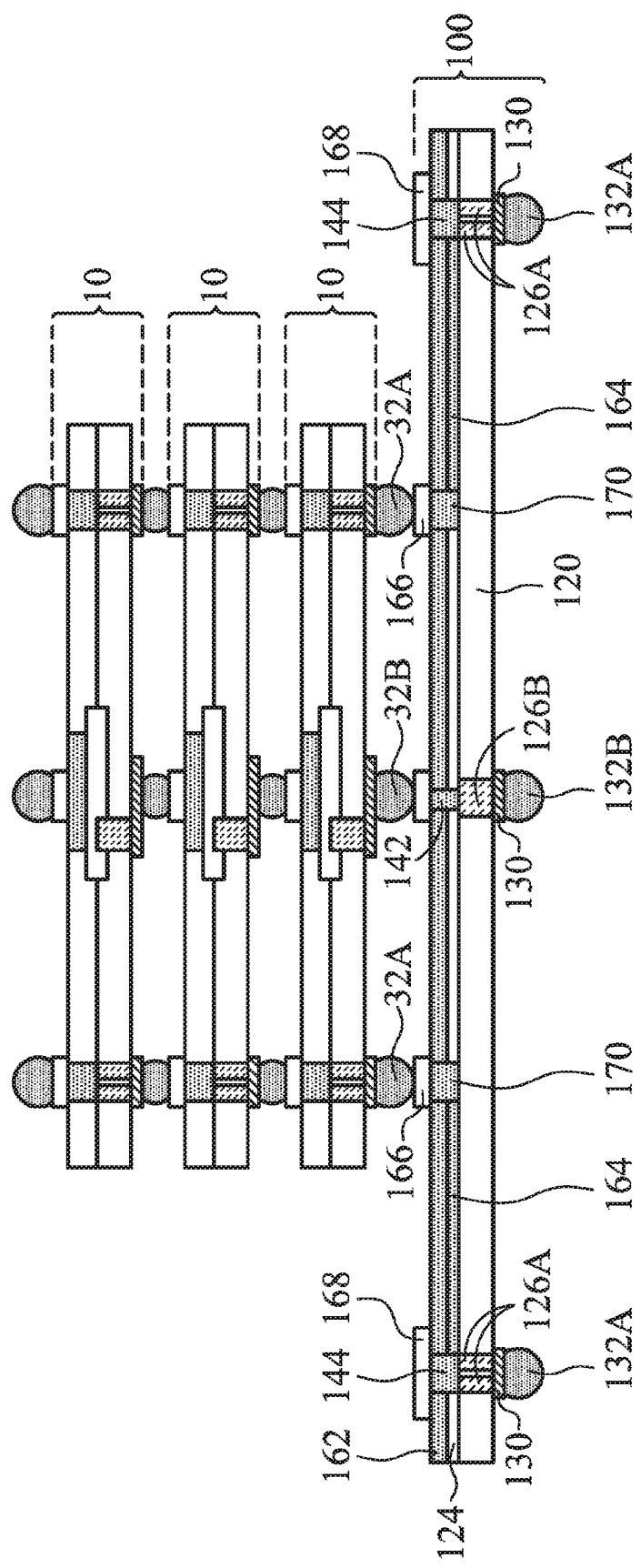

FIG. 3 illustrates a package structure in accordance with alternative embodiments. This structure is similar to the structure in FIG. 2, except that metal lines 164, instead of formed over dielectric layer 162, are formed under dielectric layer 162, which may comprise a polymer layer. For example, metal lines 164 may be underlying dielectric layer 162 that is formed of polyimide. Discrete metal pads 166 and 168 are formed over dielectric layer 162, and are electrically coupled to each other through metal line 164. Connectors 32A may be bonded to metal pads 166, which are overlapped by dies 10, while metal pads 168 are not overlapped by dies 10. Metal lines 164 may be aluminum copper lines in some embodiments. Furthermore, seal ring 144 and interconnect structure 142 may extend to the same layer as metal lines 164. Metal pads 166 and 168 are inter-coupled through seal ring 144 and metal features 170 in these embodiments. Metal features 170 are in the same layer, and may be formed of a same material, as metal lines 164. In these embodiments, seal-ring-comprising thermal path 60 further expands into interposer 100 to include metal pads 166 and 168, metal feature 170, and possibly a portion of seal ring 144. The heat generated in dies 10 may thus be conducted to metal pads 166 and 168 and conductors 132A through the interconnected seal-ring-comprising thermal paths 60 in dies 10. Seal-ring comprising thermal paths 60 in accordance with these embodiments may also be electrically floating or may be electrically grounded.

FIG. 4 illustrates a top view of portions of dies 10 and interposer 100 in accordance with some embodiments. As shown in FIG. 4, seal ring 44 forms a full ring, which may include four sides, each adjacent to one edge of the respective die 10. Features 54/56/58 are formed overlying and connected to seal ring 44. Features 54/56/58 may be spaced apart from each other with a substantially uniform pitch P1, which may be between about 0.4 μm and about 50 μm. The top view shapes of solder regions 58 may be circles or ovals. Metal lines 164 may be arranged as parallel metal lines that extend from die 10 outwardly to seal ring 144. Width W1 and the thickness of metal lines 164 may be increased to increase the heat dissipation efficiency. Pitch P2 of metal lines 164 may also be reduced to increase the heat dissipation efficiency.

Figure 5:
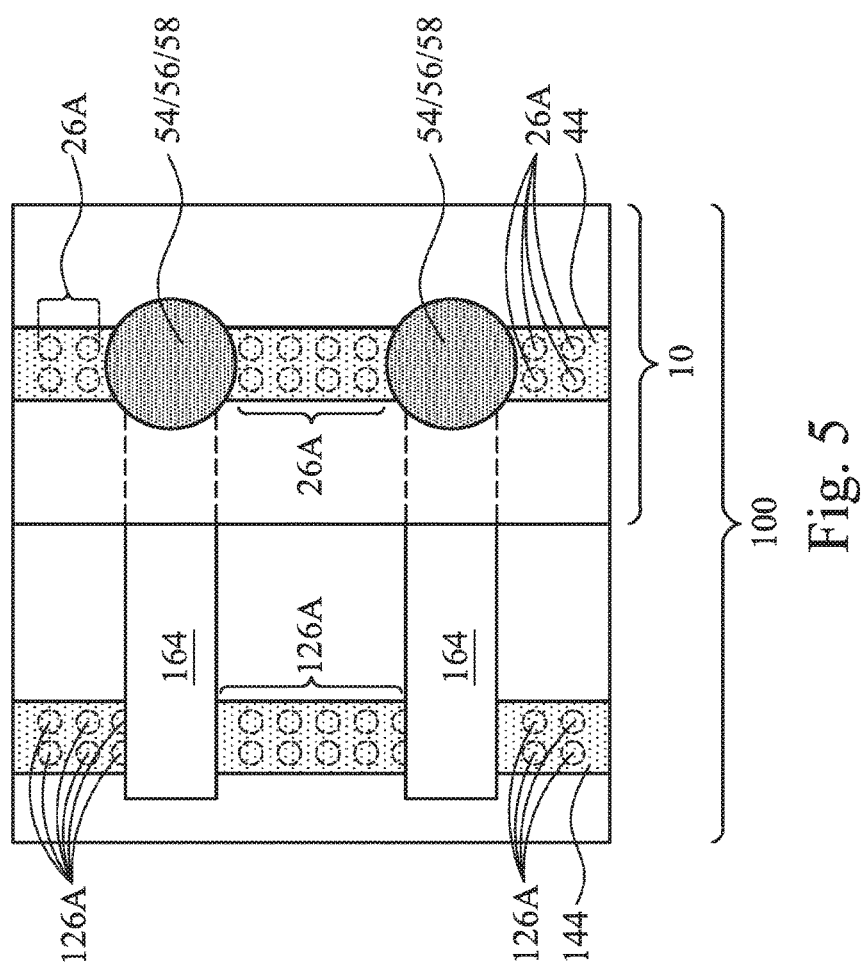

FIG. 5 illustrates a top view of a portion of the package structure in FIGS. 2 and 3. As shown in FIG. 5, metal lines 164 connect seal ring 44 in dies 10 to seal ring 144 in interposer 100, so that the heat generated in dies 10 may be dissipated to metal lines 164, and to seal ring 144. FIG. 5 also illustrates through-vias 26A in dies 10, and through-vias 126A in interposer 100.

In the embodiment, seal rings and through-vias in dies are used as thermal conductors to conduct the heat generated in dies. Since seal rings and through-vias may be formed of metals, which are good thermal conductors, the seal-ring-comprising thermal paths are effective in conducting heat. The heat generated in the dies may thus be conducted more efficiently. Simulation results indicated that when seal-ring-comprising thermal paths are not used, the respective package including stacked dies and an interposer has a Ψjc value equal to about 0.99 K/W, wherein the Ψjc value is a measurement of the temperature difference caused by the generated heat. Greater Ψjc values indicate that the heat dissipation efficiency is worse, and smaller Ψjc values indicate that the heat dissipation efficiency is better. As a comparison, in the embodiments, the package having the seal-ring-comprising thermal paths has a Ψjc value equal to about 0.89 K/W, which indicates that better heat dissipation is achieved, and the temperature of the resulting package is lower.

In accordance with embodiments, a die includes a semiconductor substrate, a through-via penetrating through the semiconductor substrate, a seal ring overlying and connected to the through-via, and an electrical connector underlying the semiconductor substrate and electrically coupled to the seal ring through the through-via.

In accordance with other embodiments, a package includes a die and an interposer bonded to the die. The die includes a semiconductor substrate, a plurality of through-vias penetrating through the semiconductor substrate, a seal ring overlapping and connected to the plurality of through-vias, and a plurality of electrical connectors underlying the semiconductor substrate and connected to the seal ring through the plurality of through-vias. The interposer is underlying and bonded to the die. The interposer includes a substrate, and a plurality of metal lines over the substrate. The plurality of metal lines is electrically coupled to the plurality of electrical connectors of the die. Each of the plurality of metal lines includes a first portion overlapped by the first die, and a second portion misaligned with the die.

In accordance with yet other embodiments, a package includes a first die and a second die bonded to the first die. The first die includes a first semiconductor substrate, a first plurality of through-vias penetrating through the first semiconductor substrate, a first seal ring overlapping and electrically coupled to the first plurality of through-vias, and a first plurality of electrical connectors overlying and electrically coupled to the first seal ring. The second die is overlying the first die. The second die includes a second semiconductor substrate, a second plurality of through-vias penetrating through the second semiconductor substrate, a second seal ring overlapping and connected to the second plurality of through-vias, and a second plurality of electrical connectors underlying the second semiconductor substrate and electrically coupled to the second seal ring. Each of the first plurality of electrical connectors is bonded to one of the second plurality of electrical connectors.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method of forming a semiconductor device, the method comprising:
    forming first through vias extending from a first side of a first substrate to a second side of the first substrate;
    forming a first seal ring over the first side of the first substrate, the first seal ring being electrically coupled to the first through vias, the first seal ring being electrically isolated from active circuitry on the first substrate; and electrically coupling the first through vias to conductive lines on a second substrate, the conductive lines extending outside an outermost boundary of the first substrate in a plan view.

2. The method of claim 1, further comprising forming a second seal ring over a first side of the second substrate, wherein the conductive lines are electrically coupled to the second seal ring.

3. The method of claim 2, wherein the second seal ring extends around the first substrate in the plan view.

4. The method of claim 2, further comprising forming second through vias extending from the first side of the second substrate to a second side of the second substrate, the second through vias being electrically coupled to the second seal ring.

5. The method of claim 2, further comprising forming a polymer layer on the first side of the second substrate, the polymer layer being interposed between the conductive lines and the second substrate.

6. The method of claim 5, wherein the second seal ring extends through the polymer layer.

7. The method of claim 1, wherein the conductive lines extend under each side of the first substrate in a plan view.

8. A method of forming a semiconductor device, the method comprising:
forming a first device having first through vias extending from a first side of a first substrate to a second side of the first substrate, the first device having a first seal ring coupled to the first through vias, the first device having active circuitry, the active circuitry being electrically isolated from the first seal ring;
forming a second device having a conductive line, wherein first portions of the second device and the conductive line are overlapped by the first device, and wherein second portions of the second device and the conductive line are not overlapped by the first device; and
electrically and thermally coupling the first seal ring to the conductive line.

9. The method of claim 8, further comprising forming a second seal ring on the second device, the second seal ring being electrically and thermally coupled to the conductive line.

10. The method of claim 9, further comprising forming an insulating layer on the second device, and wherein forming the second seal ring comprises forming the second seal ring in the insulating layer.

11. The method of claim 9, wherein the second device comprises second through vias, the second through vias being electrically coupled to the second seal ring, and further comprising forming external connectors on the second device, the external connectors being electrically coupled to the second through vias, the second device being interposed between the external connectors and the first device.

12. The method of claim 11, wherein the second through vias are arranged in a plurality of rows.

13. The method of claim 8, wherein the first through vias are arranged in a plurality of rows.

14. A method of forming a semiconductor device, the method comprising:
forming a first die having a first seal ring coupled to first through vias, the first die having active circuitry, the active circuitry being electrically isolated from the first seal ring; and
electrically coupling the first die to an interposer, the interposer having a second seal ring and conductive lines coupled to the second seal ring, wherein the first seal ring is electrically and thermally coupled to the conductive lines, wherein a first width between a first inner sidewall of the second seal ring and a second inner sidewall of the second seal ring opposite the first inner sidewall is greater than a second width between a first edge of the first die and a second edge of the first die opposite the first edge.

15. The method of claim 14, wherein the second seal ring completely surrounds the first die in a plan view.

16. The method of claim 14, further comprising coupling a second die to the first die, wherein the second die comprises a third seal ring, wherein the third seal ring is electrically and thermally coupled to the first seal ring.

17. The method of claim 14, wherein the conductive lines extend from under the first die to the second seal ring.

18. The method of claim 14, wherein the conductive lines are arranged such that a plurality of conductive lines extend from each side of the first die in a plan view.

19. The method of claim 14, wherein at least one conductive line of the conductive lines extends from each side of the first die in a plan view.

20. The method of claim 14, wherein the second seal ring is spaced apart from the first die in a plan view.

* * * * *